United States Patent [19]

Sasaki et al.

[11] Patent Number: 4,599,729
[45] Date of Patent: Jul. 8, 1986

[54] SEMICONDUCTOR LASER DEVICE HAVING FACETS PROVIDED WITH DIELECTRIC LAYERS

[75] Inventors: Yoshimitsu Sasaki; Takashi Kajimura, both of Nishitama; Naoki Chinone, Hachioji; Michiharu Nakamura, Tokyo, all of Japan

[73] Assignee: Hitachi, Ltd., Tokyo, Japan

[21] Appl. No.: 578,530

[22] Filed: Feb. 9, 1984

[30] Foreign Application Priority Data

Feb. 9, 1983 [JP] Japan ................................. 58-18825

[51] Int. Cl.$^4$ .............................................. H01S 3/19
[52] U.S. Cl. .......................................... 372/49; 357/17
[58] Field of Search ....................... 372/49, 43, 44, 48; 357/17, 52

[56] References Cited

U.S. PATENT DOCUMENTS 4,092,659 5/1978 Ettenberg .............................. 372/49
4,337,443 6/1982 Umeda et al. ......................... 372/49

OTHER PUBLICATIONS

Ettenberg, "A New Dielectric Facet Reflector for Semiconductor Lasers", *Applied Physics Letters,* 32(11), Jun. 1, 1978, pp. 724–725.

*Primary Examiner*—James W. Davie
*Attorney, Agent, or Firm*—Antonelli, Terry & Wands

[57] ABSTRACT

In a semiconductor laser device of the type which includes at least one laminate of a first dielectric layer and a second dielectric layer on at least one of the two facets of a resonator and in which the refractive index of the first dielectric layer is lower than that of the second dielectric layer, the improvement wherein the second dielectric layer consists of an amorphous material containing silicon and hydrogen at its essential constituent elements.

14 Claims, 7 Drawing Figures

SEMICONDUCTOR LASER DEVICE HAVING FACETS PROVIDED WITH DIELECTRIC LAYERS

BACKGROUND OF THE INVENTION

1. Field of the Invention

This invention relates generally to a semicondutor laser device and more particularly, to the structure of resonator facets.

2. Description of the Prior Art

Coating of a light emitting output facet of a semiconductor laser device has been primarily directed to prevent facet erosin in the past. Recently, attempts have been made to raise the refractive index by use of a multi-layered film on one side and to reduce the refractive index on one side. However, these attempts provide merely the advantages that the differential quantum efficiency can be improved and the limit of the optical output that can be taken out can be increased.

The following references can be cited to show the state of art.
(1) Applied Physics Letters, Vol. 30, No. 2, 15 January, 1977, p 87–88
(2) Applied Optics, Vol. 10, No. 7, July, 1971, p 1591–1596
(3) IEEE JOURNAL OF QUANTUM ELECTRONICS, Vol. QE-17, No. 9, September, 1981, p 1950-1954

SUMMARY OF THE INVENTION

The present invention contemplates to prolong the service life of the device while restricting the increase in a threshold current, that is, while keeping a high optical output.

The semiconductor laser device of the present invention has at least the following structure.

At least one laminate of first and second dielectric layers is disposed on at least one of the two resonator facets of a semiconductor laser, the refractive index of the first dielectric layer is smaller than that of the second dielectric layer and the second dielectric layer consists of an amorphous material containing silicon and hydrogen as its essential constituent elements.

It is of importance that this amorphous material contains hydrogen. When the amorphous material is expressed by the formula $Si_{1-x}H_x$, hydrogen is contained in the range of $0.002 \leq x \leq 0.4$. Particularly, the range of the hydrogen concentration is preferably from 0.03 to 0.4.

A plurality of the laminates of the first and second dielectric layers may be disposed.

To realize a high optical output, the refractive index of one of the resonator facets is increased by the laminate of the dielectric layers. The thickness of each dielectric layer is determined in the following manner. The thickness of the first and second dielectric layes are substantially $\lambda/4n_1$ and $\lambda/4n_2$, respectively, where $\lambda$ is the oscillation wavelength of the laser (nm) and $n_1$ and $n_2$ are the refractive indices of the first and second dielectric layers.

It is of course possible to dispose the laminate of the dielectric layers described above on one facet and an ordinary passivation film, on the other facet.

It is extremely preferred to dispose a dielectric layer on the other facet in order to reduce the facet refractive index. If the thickness of the dielectric layer is virtually $\lambda/4n'$ (where $\lambda$ is the oscillation wavelength (nm) of the laser and $n'$ is the refractive index of the dielectric layer), the refractive index on this facet becomes minimal.

DESCRIPTION OF THE PREFERRED EMBODIMENTS

A so-called CSP type laser device using $Ga_{1-x}Al_xAs$ (x=0.05; oscillation wavelength $\lambda=830$ nm) will be described as an example of the semiconductor laser.

The term "CSP type laser" represents a "channeled-substrate-planar laser" and is described, for example, in IEEE JOURNAL OF QUANTUM ELECTRONICS, Vol. QE-14, No. 2, February 1978, p 89–92.

Figure 1:
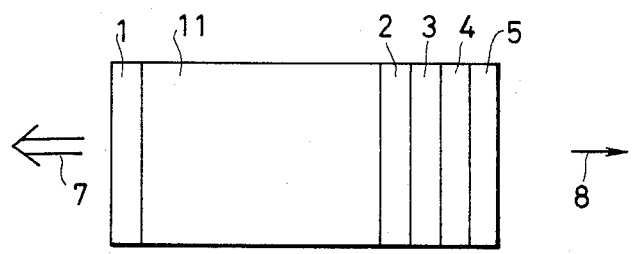
FIGS. 1, 4, 5 and 7 are sectional views of the seimiconductor laser devices in accordance with some embodiments of the present invention, respectively.

FIG. 1 is a sectional view of the semiconductor laser device on the plane parallel to the travelling direction of the laser light. Reference numeral 2 represents a first dielectric film; 3 is a second dielectric film; 4 is a third dielectric film; 5 is a fourth dielectric film; 1 is a fifth dielectric film; and 11 is a GaAlAs type laser device component. Reference numerals 7 and 8 represent the laser light that is emitted and are from the low and high refractive index sides, respectively.

In the embodiment to be described below, sputtering is used as a method of depositing the dielectric films, $SiO_2$ is used as the fifth, first and third dielectric films and amorphous Si is deposited as the second and fourth dielectric films.

First, the semiconductor laser device is set inside a sputtering apparatus and the fifth dielectric film, i.e., $SiO_2$, (refractive index $n_1$: 1.45) 1 is deposited on one facet in a film thickness of $\lambda/4n_1$, that is, 140 nm, by the discharge of the Ar gas using $SiO_2$ as a target. Here, $\lambda$ represents the oscillation wavelength of the laser. Next, the first dielectric film $SiO_2$ (refractive index $n_2$: 1.45) is deposited in the same way on the other facet in a film thickness of $\lambda/4n_2$, that is, 140 nm. Here, the target is changed to Si and while a $H_2$ gas is mixed in a quantity of about 50% in the Ar gas in terms of a partial pressure ratio, the discharge of the Ar gas is effected to deposit the second dielectric film, that is, the amorphous Si (refractive index $n_3$: 3.3) in a film thickness of $\lambda/4n_3$, that is, 60 nm. The same procedures are repeated so as to deposit a 140 nm-thick third dielectric $SiO_2$ film and a 60 nm-thick fourth dielectric amorphous Si film. In the steps described above, the refractive index of the low refractive film (fifth dielectric film) is about 7% while that of the high refractive films (first through fourth dielectric films) is about 90%.

Figure 2:
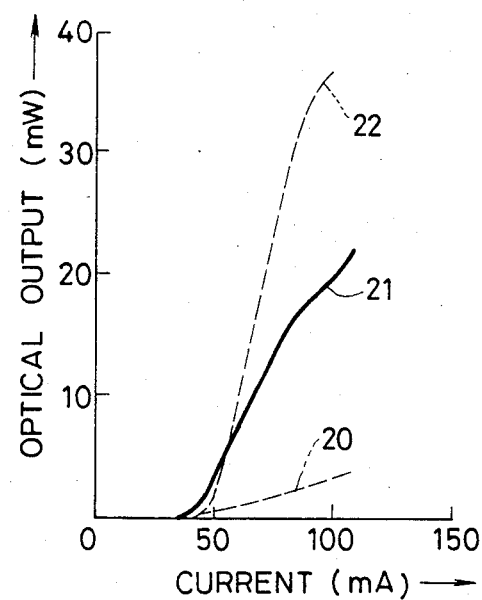
FIGS. 2 and 6 are diagrams showing the electrooptical characteristics of the semiconductor laser device, respectively.

FIG. 2 illustrates the current-v-optical output characteristics of the laser device produced by this method. Solid line 21 represents the characteristics before coating, dotted line 22 represents the characteristics when the light is taken out from the side of the low refractive film and dotted line 20 represents the characteristics when the light is taken out from the side of the high refractive films. As can be understood from the diagram, the effect that the greater optical output can be taken out from the low refractive side even if the internal energy of the light is the same can be obtained by using the construction in which one facet of the laser device is kept at a low refractive index with the other at a high refractive index and the optical output is taken out from the side of the low refractive film. According to this construction, the differential quantum efficiency and the kink level can be improved. The following table illustrates the current-v-optical output characteristics of semiconductor laser devices having various facet structures:

TABLE 1

| Facet Structure | | Threshold Current (rated) | Differential Quantum Efficiency (rated) | Kink Level (rated) |
|---|---|---|---|---|
| Front | Rear | | | |
| 1 SiO$_2$ $\frac{\lambda}{2}$ | SiO$_2$ $\frac{\lambda}{2}$ | 1 | 1 | 1 |
| 2 SiO$_2$ $\frac{\lambda}{2}$ | SiO$_2$ $\frac{\lambda}{4}$ – a – Si:H $\frac{\lambda}{4}$ (four-layered laminate structure) | 0.85 | 1.5 | 1.5 |
| 3 SiO$_2$ $\frac{\lambda}{4}$ | SiO$_2$ $\frac{\lambda}{2}$ | 1.2 | 2.0 | 2.0 |
| 4 SiO$_2$ $\frac{\lambda}{4}$ | SiO$_2$ $\frac{\lambda}{4}$ – a – Si:H $\frac{\lambda}{4}$ (four-layered laminate structure) | 1.1 | 2.5 | 2.5 |

Sample numbers 1 and 3 represent comparative examples. The differential quantum efficiency can be raised and the kink level can be drastically improved while maintaining the high optical output by disposing a laminate of dielectric layers capable of increasing the refractive index of the facet on the rear surface, in whichever manner the passivation layer to be disposed on the front surface may be set. A difference occurs in the levels of the various characteristics described above depending upon the thickness of the passivation layer disposed on the front surface, but the effect described above can be realized in all cases by disposing the laminate layer of the dielectric layers of the present invention on the rear surface. This can be understood by comparing the samples No. 1 with No. 2 and No. 3 with No. 4.

The terms "SiO$_2\lambda/2$" and "SiO$_2\lambda/4$" in the table above mean that when the wavelength of the laser light is $\lambda$, the SiO$_2$ layer is $\lambda/2$-thick and $\lambda/4$-thick, respectively. The term "SiO$_2\lambda/4$-a-Si:H (four-layered laminate)" means that $\lambda/4$-thick SiO$_2$ films and $\lambda/4$-thick H-containing amorphous silicon are disposed alternately in four layers, that is, two pairs of SiO$_2$ layer and H-containing amorphous silicon layer are laminated.

In Table 1 described above, the thickness of the passivation layer on the front surface is only two kinds, i.e., $\lambda/2$ and $\lambda/4$, but the effect of the present invention can be provided in accordance with each level when a different thickness is employed or the passivation layer consists of a laminate. A laminate of four or more layers can be of course used for the structure on the rear surface.

The combination of the passivation layer shown in No. 4 of Table 1 is most preferred in order to accomplish a large output and long service life.

In this case, a threshold current somehow increases in comparison with the sample No. 1 but the advantage of the drastic improvement in both differential quantum efficiency and kink level can be obtained. The latter can sufficiently make up for the considerable increase in the threshold current.

It is essentially necessary in the present invention to use an amorphous material containing silicon and hydrogen as the indispensable constituent elements, for the second dielectric layer.

Amorphous silicon containing hydrogen has the properties such that its refractive index is high for use in a high refractive film, its insulation resistance is high and its optical loss is small. The effect brought forth by H-containing slicon is particularly remarkable in Si$_{1-x}$H$_x$ $(0.03 \leq x \leq 0.4)$. If x is greater than 0.4, the film becomes brittle and can not be used suitably as the passivation layer.

Table 2 below illustrates various characteristics of amorphous silicon in comparison with H-containing amorphous silicon.

TABLE 2

| | a - Si | A—Si: H (H: 20 at %) |
|---|---|---|
| Insulation resistance | 10$^{14}$ cm | 10$^{13}$ cm |
| Absorption coefficient | 2 × 10$^4$ (cm$^{-1}$) | 50 (cm$^{-1}$) |
| Number of dangling bonds | large | small |

Since the temperature rises as the facet absorbs the light, it is extremely preferred that the absorption coefficient is as small as possible. The passivation layer preferably has high insulation resistance.

Figure 3:
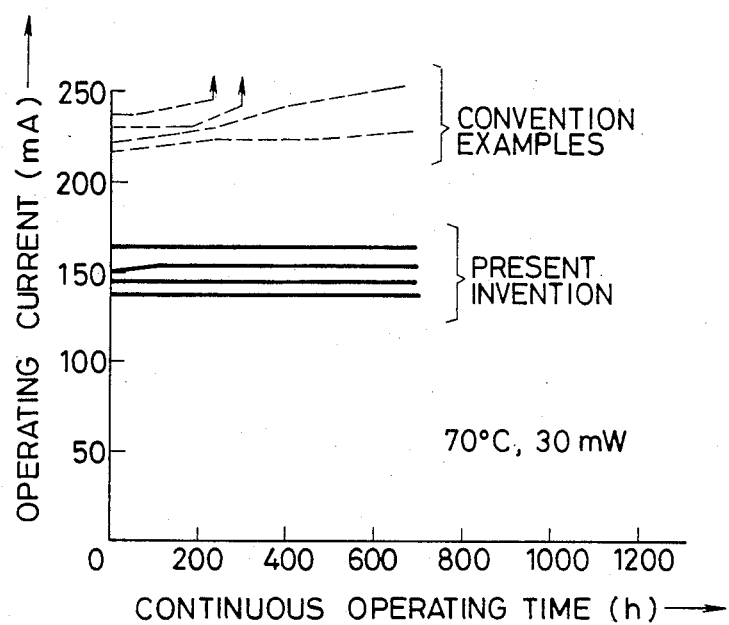
FIG. 3 is a diagram showing the life characteristics of the semiconductor laser device.

FIG. 3 shows an example of the result of the life test characteristics when the sample No. 4 of the present invention is operated at 70° C. and 30 mW. Solid line represents the characteristics of the sample of the present invention and dotted line does those of the prior art structure. Since the prior art device is operated above the kink level, the operating current increases drastically and hence, the life characteristics are not good. Due to the advantages that the present device is operated in the region of the line of the I–L characteristics and the operating current is small because the differential quantum efficiency is high, the sample of the invention has excellent life characteristics. Though the sample uses SiO$_2$ for the fifth, first and third dielectric films, similar effects can also be obtained when Al$_2$O$_3$ or Si$_3$N$_4$ is used for the dielectric films.

Figure 4:
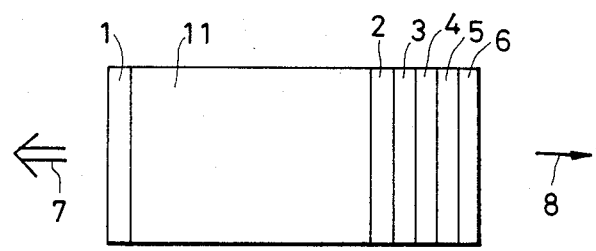

FIG. 4 illustrates an example in which a dielectric film 6 (sixth dielectric film) consisting of SiO$_2$ is further deposited on the semiconductor laser device having the structure of FIG. 1 in a film thickness of $\lambda/20n_6 \sim \lambda/2n_6$ ($\lambda$: oscillation wavelength of laser; n$_6$: refractive index), that is, 28 to 280 nm by a sputtering device. The electric and optical characteristics of the resulting laser are similar to those of the device shown in FIG. 1 and the resistance of the device the environment can be further improved.

The methods of depositing the first through sixth dielectric films include CVD (chemical vapor deposition), plasma, CVD, vapor deposition and sputtering. Among them, CVD is not suitable because the treating temperature is at least 400° C. which is the limit of the heat-resistance of the electrode of the semidconductor laser. Though the treating temperature is about 300° C. for plasma CVD and arbitrary for vapor deposition, bondability is not always satisfactory by these methods.

Another problem with these methods is that a natural oxide film is formed on the facet of the semiconductor crystal and the passivation effect can not much be expected if the dielectric films are deposited while the semiconductor crystal is under such a state. However, the sputtering method makes it possible to employ a sputter-etching mechanism so that the dielectric films can be effectively deposited after removing the natural oxide film on the crystal facet, as reported in Japanese Utility Model Laid-Open No. 6267/1982. It is well known in the art that bondability of the sputtered film is superior to that of the films deposited by vapor deposition and the like. Accordingly, the most excellent method is one that forms the facet coating to the semiconductor laser device by sputtering.

Figure 5:
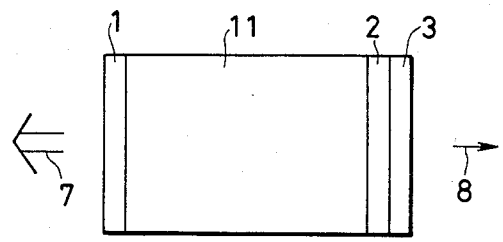
Figure 7:
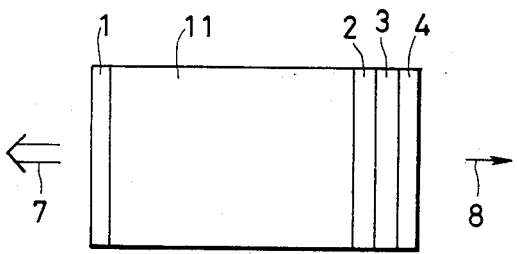
Figure 6:
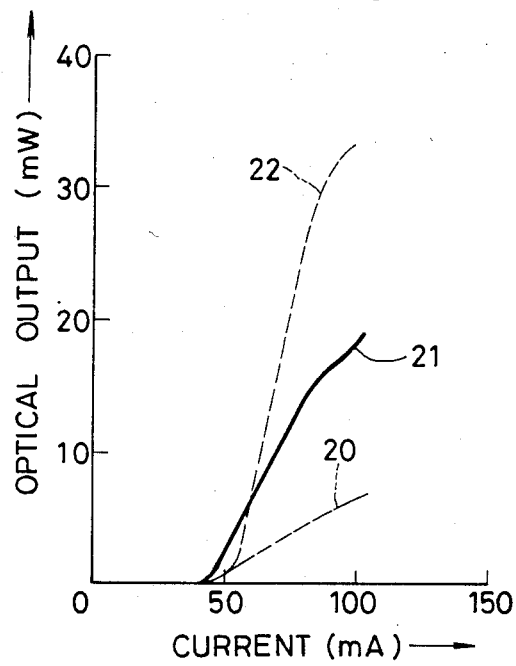

The foregoing explains the semiconductor laser device having a four- or five-layered structure as the high refractive film (refractive index: ~90%). Depending upon the intended application of the semiconductor laser, however, a two- or three-layered structure may also be employed if the refractive index of the high refractive film is somewhat reduced (to ~70%, for example) and an optical output is taken out a little more greatly from the side of the high refractive film for monitoring. FIG. 5 illustrates an example of such an embodiment. Reference numeral 1 represents the fifth dielectric film; 2 is the first dielectric film; 3 is the second dielectric film; and 11 is the GaAlAs type laser device. The method of producing the semiconductor laser device is the same as the method of producing the laser device having the four-layered structure that is described previously. FIG. 6 shows the current-v-optical output characteristics of the semiconductor laser device produced by this method. Solid line 21 represents the characteristics before coating, dotted line 22 represents the characteristics when the optical output is taken out from the side of the low refractive film and dotted line 23, the characteristics when the light is taken out from the side of the high refractive film. As can be understood from the diagram, the optical output can be taken out more greatly from the side of the high refractive film, too, than in the case of the four- and five-layered structures. FIG. 7 shows the embodiment in which the dielectric film 4 (sixth dielectric film) consisting of $SiO_2$ is further deposited to the semiconductor laser device of FIG. 5 in a film thickness of $\lambda/20n_x \sim \lambda/2n_x$ ($\lambda$: oscillation wavelength of laser, $n_x$: refractive index). The production method of this device may be the same as the method of producing the five-layered structure described earlier. This embodiment further improves the resistance of the two-layered structure against the environment.

Though the $Ga_{1-x}Al_xAs$ (x=0.05) CSP type laser has been explained as the semiconductor laser device, there is no limitation, in particular, to the crystal material so long as it has the refractive surface as the optical resonator. The method of the present invention can be obviously applied to a BH type laser and other various semiconductor laser devices beside the CSP type laser. Incidentally, the term "BH type" represents a "buried-heterostructure type", which is introduced in Journal of Applied Physics, Vol. 45, No. 11, 1974, pp. 4899–4906, for example.

In accordance with the present invention, the optical output on the rear surface of the semiconductor laser device, that has not been used effectively in the past, is restricted and the optical output on the front surface is increased as much in order to increase the optical output to be taken outside even if the internal energy of the light is the same. Thus, the present invention can improve the laser characteristics, that is, the kink level and the differential quantum efficiency, by 2.5 times (in comparison with the prior art devices). The operating current at the time of the high output operation at 70° C. and 30 mn can be reduced from 200 mA (in the prior art devices) to 150 mA and the life characteristics can be remarkably improved.

What is claimed is:

1. A semiconductor laser device of the type which includes at least one laminate of a first dielectric layer and a second dielectric layer on one of two facets of a resonator and in which the refractive index of said first dielectric layer is lower than that of said second dielectric layer, wherein said second dielectric layer consists of an amorphous material containing silicon and hydrogen as its essential elements and the other of said two facets is provided with a coating consisting of a single dielectric layer so as to provide said other of the two facets with a lower refractive index than that of said one of the two facets.

2. The semiconductor laser device as defined in claim 1 wherein said laminate of said first and second dielectric layers improves the refractive index of said facet on which they are deposited.

3. The semiconductor laser device as defined in claim 1 wherein the thickness of said first and second dielectric layers are substantially $\lambda/4n_1$ and $\lambda/4n_2$, respectively, where $\lambda$ is the oscillation wavelength of the laser and $n_1$ and $n_2$ are the refractive indices of said first and second dielectric layers.

4. The semiconductor laser device as defined in claim 1 wherein said amorphous material containing silicon and hydrogen as its essential constituent elements has a composition $Si_{1-x}H_x$ (where $0.002 \leq x \leq 0.4$).

5. The semiconductor laser device as defined in claim 1 wherein said amorphous material containing silicon and hydrogen as its essential constituent elements has a composition $Si_{1-x}H_x$ (where $0.03 \leq x \leq 0.4$).

6. The semiconductor laser device as defined in any one of claims 1 through 5 wherein the thickness of said single dielectric layer with which said other of the two facets is provided is substantially $\lambda/4n'$, where $\lambda$ is the oscillation wavelength of the laser and $n'$ is the refractive index of said single dielectric layer.

7. The semiconductor laser device as defined in any one of claims 1 through 5 wherein a plurality of said laminates consisting of said first and second dielectric layers are deposited on said one of the two facets.

8. In a semiconductor laser device having dielectric films on two facets for taking out the emitted optical output of a semiconductor laser, the improvement wherein a first dielectric film having a low refractive index ($n_1$), a second dielectric film having a high refractive index ($n_2$), a third dielectric film having a low refractive index ($n_3$) and a fourth dielectric film having a high refractive index ($n_4$) are sequentially laminated on one of the two facets in the thickness of $\lambda/4n_1$, $\lambda/4n_2$, $\lambda/4n_3$ and $\lambda/4n_4$ ($\lambda$=oscillation wavelength of the laser), respectively, and the other of the two facets is provided with a coating consisting of a fifth dielectric film having a refractive index $n_5$, the fifth dielectric film having a thickness of $\lambda/4n_5$ (where $n_5$, $n_1$, $n_3 < n_2$, $n_4$), and wherein the second and fourth dielectric films consist of an amorphous material containing silicon and hydrogen.

9. The semiconductor laser device as defined in claim 8 wherein a sixth dielectric film is further deposited on said fourth dielectric film in a thickness of $\lambda/20n_6 \sim \lambda/2n_6$ ($n_6$: refractive index).

10. The semiconductor laser device as defined in claim 9 wherein said sixth dielectric film consists of a $SiO_2$ film, $Al_2O_3$ film or $Si_3N_4$ film.

11. The semiconductor laser device as defined in claim 8 wherein said fifth, first and third dielectric films consist of a $SiO_2$ film, $Al_2O_3$ film or $Si_3N_4$ film while said second and fourth dielectric films consist of a hydrogen-containing amorphous Si film.

12. The semiconductor laser device as defined in any one of claims 1 through 5 wherein the single dielectric layer is made of a material selected from the group consisting of $SiO_2$, $Al_2O_3$ and $Si_3N_4$.

13. The semiconductor laser device as defined in claim 12 wherein the single dielectric layer is made of $SiO_2$.

14. The semiconductor laser device as defined in claim 11 wherein said fifth, first and third dielectric films consist of a $SiO_2$ film.

* * * * *